United States Patent [19]

Suzuki

[11] Patent Number: 5,057,860
[45] Date of Patent: Oct. 15, 1991

[54] PRESSURE DEVELOPING DEVICE PROVIDED IN AN IMAGE RECORDING APPARATUS

[75] Inventor: Tsuyoshi Suzuki, Aichi, Japan

[73] Assignee: Brother Kogyo Kabushiki Kaisha, Japan

[21] Appl. No.: 592,959

[22] Filed: Oct. 3, 1990

[30] Foreign Application Priority Data

Oct. 11, 1989 [JP] Japan .............................. 1-119023[U]
Oct. 11, 1989 [JP] Japan .............................. 1-119024[U]

[51] Int. Cl.$^5$ .............................................. G03B 27/32
[52] U.S. Cl. ...................................... 352/27; 354/304; 100/160; 100/168; 100/176
[58] Field of Search ..................... 355/27, 28; 354/297, 354/301, 304; 100/160, 162 B, 168, 170, 176; 430/138

[56] References Cited

U.S. PATENT DOCUMENTS

| | | | |
|---|---|---|---|
| 4,399,209 | 8/1983 | Sanders et al. | 430/138 |
| 4,714,943 | 12/1987 | Sakakibara et al. | 355/27 |
| 4,920,375 | 4/1990 | Akao et al. | 355/27 |
| 4,945,374 | 7/1990 | Yamamoto et al. | 355/27 X |

FOREIGN PATENT DOCUMENTS 62-156952 10/1987 Japan .

Primary Examiner—Brian W. Brown
Assistant Examiner—Khanh Dang
Attorney, Agent, or Firm—Oliff & Berridge

[57] ABSTRACT

A pressure developing device in an image recording apparatus for recording an image on the recording medium, includes a pair of pressure developing rollers to be separated from and contacted with each other, and a pressurizing unit disposed on either one of the pressure developing rollers for pressurizing one of the pressure developing rollers toward or away from the other of the pressure developing roller. A pressure control unit controls the pressurizing unit in such a fashion that one of the pressure developing rollers is placed in contact with and pressurized against the other of the pressure developing rollers under a plurality of pressure conditions by the pressurizing unit so that the pressure strength between a pair of pressure developing rollers is gradually decreased from the center to the ends along the axial direction of the developing rollers. The pressure control unit also controls the pressurizing unit in such a fashion that the one of pressure developing rollers can be separated from the other of the pressure developing rollers.

15 Claims, 9 Drawing Sheets

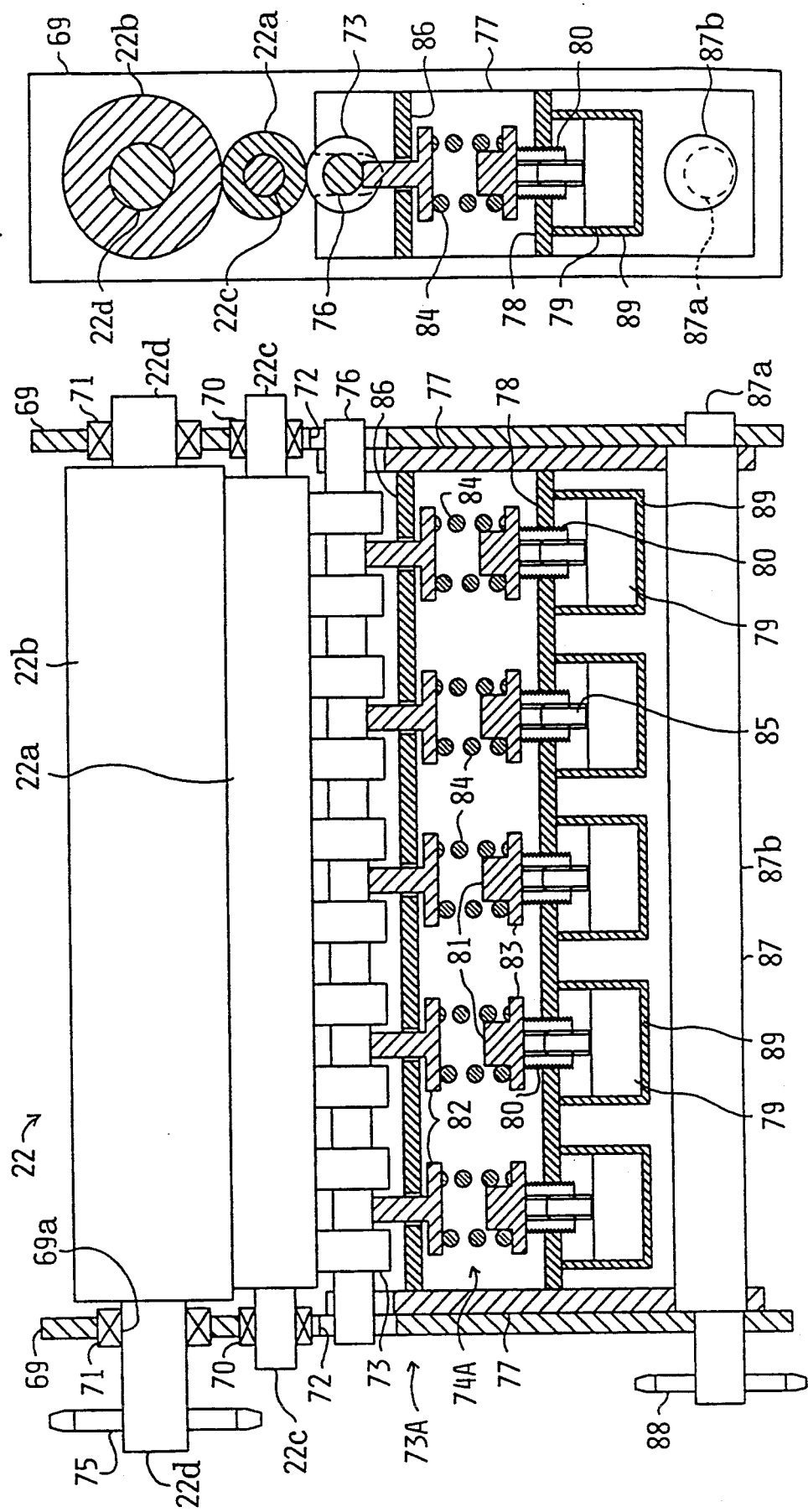

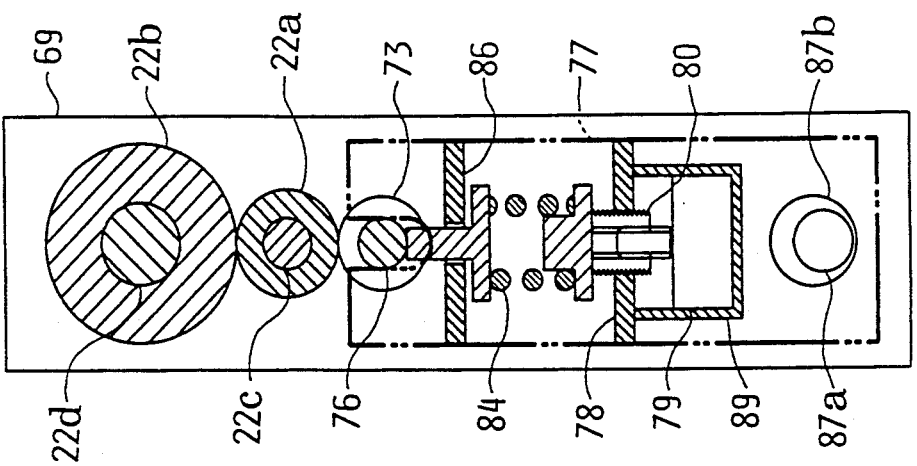
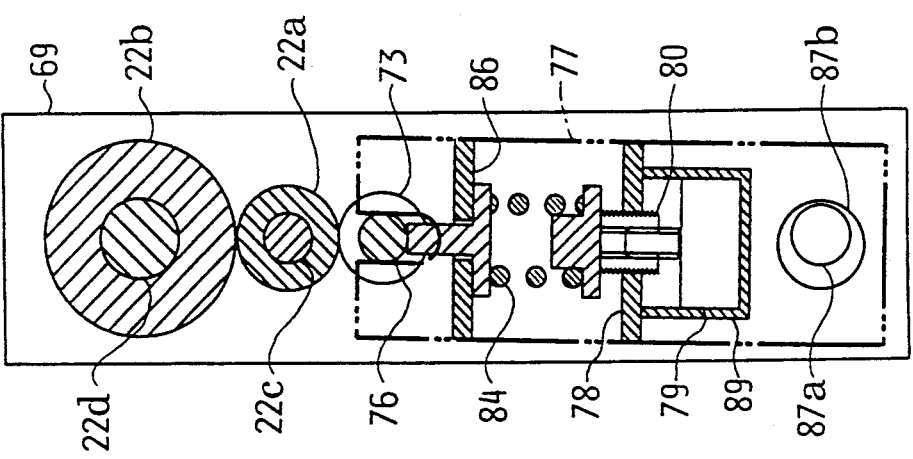
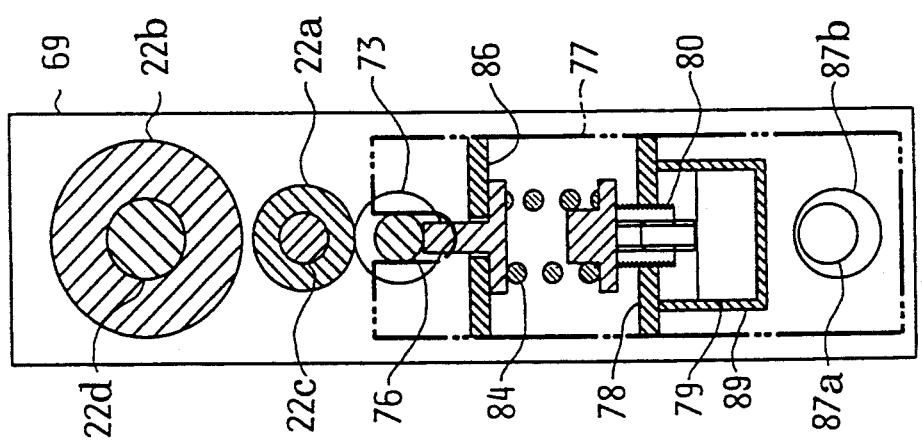

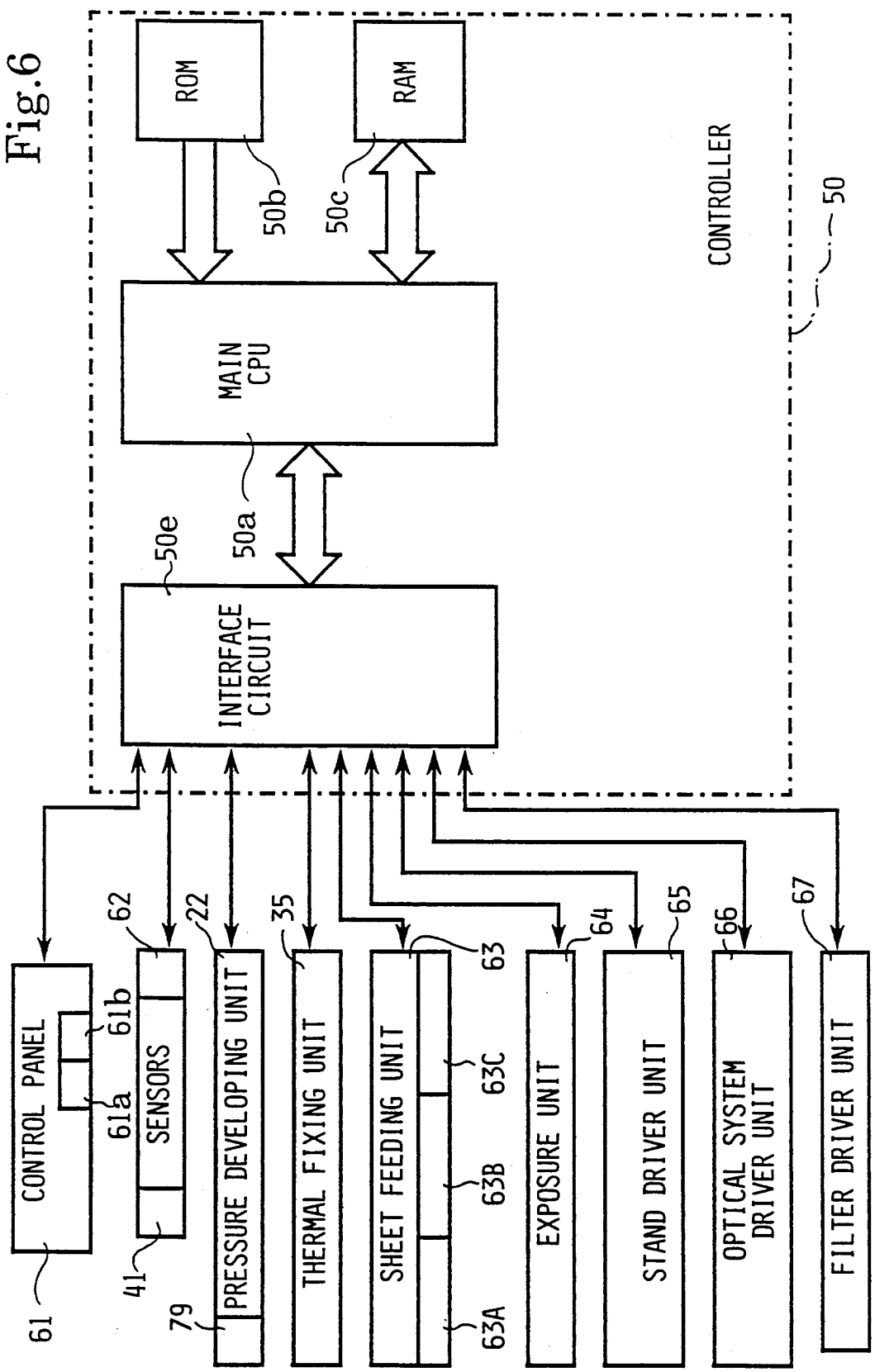

PRESSURE DEVELOPING DEVICE PROVIDED IN AN IMAGE RECORDING APPARATUS

BACKGROUND OF THE INVENTION

1. Field of the invention

The present invention relates to an image recording apparatus such as a copying machine or a printer in which a recording medium is employed and more particularly to a pressure developing device which applies pressure to the recording medium.

2. Description of the Related Art

Generally, an image recording apparatus of this kind employs, for instance, as disclosed in U.S. Pat. No. 4,920,375, a continuous form of photosensitive and pressure sensitive recording medium coated with a plurality of photosensitive and pressure sensitive microcapsules with each of said microcapsules enveloping therein a chromogenic material and a photo-curable resin, and a developer medium provided with a developing material which provides an output image upon reaction with the chromogenic material.

The image recording apparatus comprises an exposure unit for exposing an optical image on photosensitive and pressure sensitive recording medium, a pair of pressure developing rollers adapted to be brought into and out of contact with each other, for pressurizing the exposed recording medium to develop a visible image, a drive unit for rotating at least one of the pressure developing rollers, a shift unit for shifting at least one of the pressure developing rollers toward or away from the other one of the pressure developing rollers, and a control unit for controlling said drive unit and said shift unit such that one of the pressure developing rollers is rotated by said drive unit when said one of the pressure developing rollers is shifted.

Further, the image recording apparatus as disclosed in U.S. Pat. No. 4,714,943 comprises a pressure strength adjusting mechanism which is constructed such that one of the rollers is biased toward the other of the rollers by coil springs through a plurality of contact rollers, and the coil springs are arranged so that the pressure strength of the coil spring is distributed corresponding to a gradual decrease from the center portion to both end portions in the direction of the axis of one of the rollers by adjustment of the lengths of the coil springs in a direction of compression.

With the above image recording devices, the latent image is formed on the recording medium by exposing the optical image thereon to selectively cure the photo-curable resins enveloped in the microcapsules existing on the area to which the optical image is exposed. The latent image thus formed on the recording medium is then transferred and developed on the separate developing medium.

Transfer of the image is executed by superposing the recording medium and the developing medium one on the other and pressurizing the superposed mediums by a pair of pressure developing rollers rotated by the drive unit while being kept in contact with each other by the shift unit, so that the softened microcapsules on the recording medium are ruptured by the applied pressure and the chromogenic materials enveloped therein stream out of the ruptured microcapsules. The stream of chromogenic materials react with the developer coated on the developing medium so as to form the visible image thereon corresponding to the above latent image.

SUMMARY OF THE INVENTION

In the pressure developing device, it is desired that the pair of pressure developing rollers be selectively out of contact with each other, to keep the pair of pressure developing rollers clean and durable in mechanical strength, when they are not operated in the developing process. And it is desired that the pressure strength between a pair of pressure developing rollers be gradually decreased from the center to both ends along the axial direction of the developing rollers by a pressure strength adjusting mechanism to prevent sheet wrinkles from occurring at both ends thereof along the direction of the width of the sheet. Also, it is desired that the shifting unit shift the rollers out of contact with each other, and the pressure strength adjusting mechanism obtain the desired distribution of the pressure strength in the pressure developing device. As a result, the pressure developing device becomes large and complicated in order to accommodate all these features in one unit.

It is an object of the present invention to overcome the above drawbacks and disadvantages, and to provide a simple and small pressure developing device compared with the conventional pressure developing device.

It is a further object to provide a pressure developing device with a pressure strength adjusting mechanism that serves a dual purpose: adjusting the pressure between the contacting rollers and separating the rollers from contact with each other.

A further object of the invention is to provide a pressure developing device having a pressure strength adjusting mechanism that serves the dual functions described above, and is compact.

In order to attain the above objects, there is provided a pressure developing device in an image recording apparatus for recording an image on a recording medium, said recording apparatus comprises:
  a pair of pressure developing rollers to be separated from and contacted with each other in a separation mode and a contact mode, respectively, the pair of pressure developing rollers each defining an axial length and being axially aligned;
  pressurizing means disposed on at least one of the pressure developing rollers for pressurizing the at least one of the pressure developing rollers against the other pressure developing roller in the contact mode and separating the at least one of the pressure developing rollers from the other of the pressure developing rollers in the separation mode; and
  pressure control means for controlling said pressurizing means in the contact mode to pressurize one of the pressure developing rollers against the other of the pressure developing rollers under a plurality of pressure conditions by said pressurizing means by varying the pressure strength between the pair of pressure developing rollers along the axial length of the rollers, and for controlling said pressurizing means in the separation mode to separate one of pressure developing rollers from the other of the pressure developing rollers.

In a preferred embodiment, each roller in the pair of pressure developing rollers includes a central axial portion located between axial end portions of the rollers, and the plurality of pressure conditions defines a varying pressure profile in which pressure gradually decreases from the central axial portion toward the axial end portions.

In the recording apparatus described above, the pressure control means controls said pressurizing means in such a fashion that one of the pressure developing rollers is pressurized against the other roller of the pressure developing roller under a plurality of pressure conditions by said pressurizing means when one of said rollers of the pressure developing rollers is contacted with the other roller of the pressure developing rollers. And the pressure control means controls said pressurizing means in such a fashion that one of said the pressure developing rollers is separated from and contacted with the other roller of the pressure developing rollers. Accordingly, the pressurizing means is employed as a simple compact unit for reciprocating the rollers toward and away from each other between separation and contacting positions, and for adjusting the pressure to be applied along the axial direction of the rollers.

BRIEF DESCRIPTION OF THE DRAWINGS

The above and other objects, features and advantages of the present invention will become more apparent from the following description when taken in conjunction with the accompanying drawings in which a preferred embodiment of the present invention is shown by way of illustrative example, and wherein:

FIG. 2 is a schematic front sectional view showing a pressure developing device in a copying machine of a first embodiment;

FIG. 3 is a schematic sectional side elevational view showing a pressure developing device in FIG. 2;

FIGS. 5(a) through 5(c) are sectional side elevational view showing a series of the operations of the pressure developing device in FIG. 3;

FIG. 6 is a block diagram showing a controller in the copying machine;

DETAILED DESCRIPTION OF THE PREFERRED EMBODIMENTS

One embodiment according to the present invention is shown in FIGS. 1–8.

Figure 1:
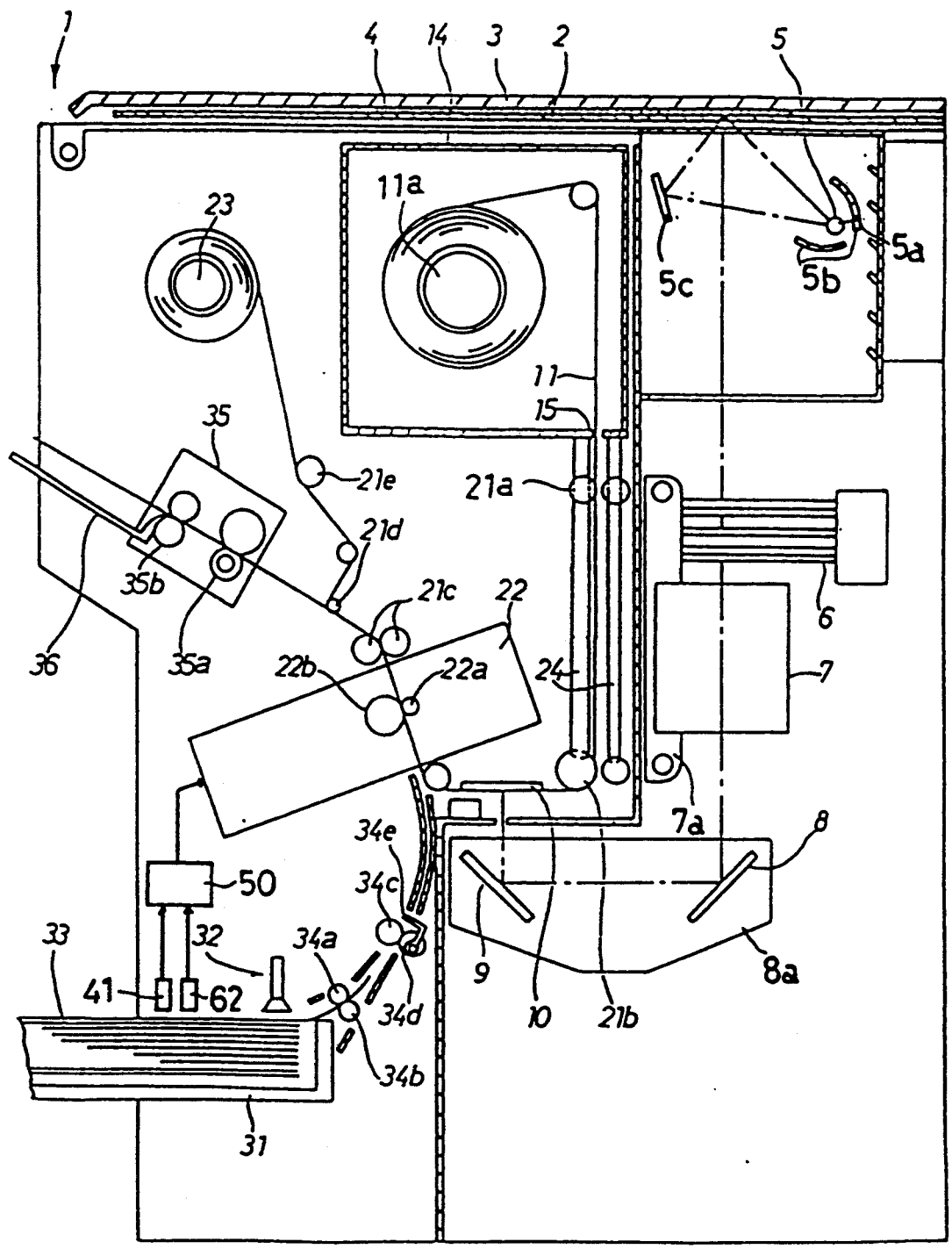
FIG. 1 is a schematic front sectional view showing a copying machine according to this invention.

FIG. 1 schematically shows a copying machine according to an embodiment of the disclosed invention.

The illustrated copying machine, generally indicated at 1, comprises a photosensitive pressure-sensitive copying machine capable of copying full-color images.

The photosensitive recording medium is of a transfer type recording medium which comprises a photosensitive recording medium and a developer recording medium. More specifically, the photosensitive recording medium comprises a photosensitive pressure sensitive recording medium provided with microcapsules which encapsulate therein a first material (chromogenic material or dye precursor) having first and second phases dependent on light exposure. The developer recording medium comprises the developer recording sheet coated on a substrate with a second material (developer material) which provides an output image upon reaction with the first material. Such an image recording medium is disclosed in, for example, U.S. Pat. No. 4,399,209 (the disclosure of which is herein incorporated by reference) and Japanese Patent Application Kokai No. 58-88739.

The copying machine employs a continuous photosensitive pressure-sensitive recording sheet such as a microcapsule sheet 11 for recording a latent image thereon, and a developer sheet 33 for receiving a developed color image from the microcapsule sheet 11.

The copying machine includes an upper panel assembly having a stand glass 2 which is movable back and forth and a stand glass cover 3 that can be placed over the stand glass 2. An original 4 to be copied is supported on the stand glass 2 which is formed of light transmissive material. The copying machine also has a light source 5 placed in an upper righthand portion thereof below the stand glass 2. The light source 5 includes a halogen lamp 5a extending in a direction normal to the direction in which the stand glass 2 is movable, and semicylindrical reflecting mirrors 5b disposed in surrounding relation to the halogen lamp 5a. The light source 5 emits a linear-line light toward the lower surface of the stand glass 2.

When the stand glass 2 moves, the light emitted from the halogen lamp 5a continuously irradiates the entire surface of the stand glass 2 from the lefthand to the righthand end thereof (as viewed in FIG. 1). The light from the light source 5 passes through the transparent stand glass 2, and is then reflected by the original 4 placed on the stand glass 2. The stand glass cover 3 covers the entire upper surface of the stand glass 2 so that the light applied to the original 4 on the stand glass 2 will not leak out from those areas of the stand glass 2 which are not covered by the original.

A reflector 5c is positioned on the lefthanded side of the light source 5 for applying lights emitted from the halogen lamp 5a to the original efficiently. The reflector 5b reflects those emitted lights which are not directed toward the stand glass 2.

The light reflected from the original on the stand glass 2 is directed downwardly and the passes through a filter 6 and a lens 7. The filter 6 serves to pass desired wavelengths of light dependent on the sensitivity of a microcapsule sheet 11 for adjusting the colors of a copied image. The lens 7 is mounted on a lens attachment 7a which is slightly adjustable with respect to the path of the light through the filter 6 and the lens 7.

The light converged by the lens 7 is directed 180 degrees back by two reflecting mirrors 8, 9 and then focused on the microcapsule sheet 11 held closely against the lower surface of an exposure table 10. The reflecting mirrors 8, 9 are mounted on a mirror attachment 8a which is slightly positionally adjustable to vary the length of the light path and the focused condition.

The microcapsule sheet 11 has a continuously elongated length which is wound around a cartridge reel 11a. The microcapsule sheet 11 is placed in a removable cartridge 14 positioned below the original support stand glass 2. A leading end portion of the microcapsule sheet 11 which is provided with a leader (not shown) consisting of a suitable sheet fixed to the leading edge, extends through several rollers 21a, 21b, 21c and a pressure developing unit 22 toward a take up reel 23 described below.

As shown in FIG. 1 the microcapsule sheet 11 drawn out of the cartridge 14 from the lower end is fed and guided by a feed roller 21a and a guide roller 21b, and extends beneath the exposure table 10 and into the pressure developing unit 22. The microcapsule sheet 11 which has passed through the pressure developing unit 22 is fed by a pair of feed rollers 21c, travels past a separator roller 21d and an adjustment roller 21e, and is then wound around the take up reel 23. The microcapsule sheet 11 discharged from the cartridge 14 remains unexposed by a light-shielding cover before the microcapsule sheet 11 reaches the exposure table 10.

The speed at which the microcapsule sheet 11 is fed is controlled so as to be held at a constant level, and remains at the same speed at which the stand glass 2 is moved. Therefore, a latent image can be formed successively line by line on the microcapsule sheet 11 when it moves past the exposure table 10.

A developer sheet cassette 31 storing a stack of developer sheets 33 is disposed below the pressure developing unit 22. One of the developer sheets 33 at a time is taken out of the cassette 31 by a sheet feed mechanism 32 which attracts the developer sheet 33 under suction. The developer sheet 33 which is taken from the cassette 31 is delivered by a feed roller 34a and a pinch roller 34b. After the leading end of the developer sheet 33 is aligned by rollers 34c, 34d and a resist gate 34e, the developer sheet 33 is fed into an inlet slot of the pressure developing unit 22.

The microcapsule sheet 11 and the developer sheet 33 are closely held against each other when they are introduced into the pressure developing unit 22. The pressure developing unit 22 includes a first pressure roller 22a and a second pressure roller 22b. The microcapsule sheet 11 and developer sheet 33 are sandwiched and pressed together between the first roller 22a and the second roller 22b. At this time, a microcapsule layer on the microcapsule sheet 11 with the latent image formed thereon and a color developer layer on the developer sheet 33 are held against each other. Those microcapsules in the microcapsule layer which are not exposed are ruptured under pressure, and developed images are transferred onto the developer sheet 33.

The microcapsule sheet 11 and the developer sheet 33 which have left the pressure developing unit 22 are fed by the rollers 21c. Then, the microcapsule sheet 11 is separated from the developer sheet 33 by the separator portion 21d. The microcapsule sheet 11 is directed upwardly, whereas the developer sheet 33 travels straight ahead into a thermal fixing unit 35. The thermal fixing unit 35 is composed a heater roller 35a and feed roller 35b. After color development on the developer sheet 33 is promoted and the color image is fixed by the heat fixing unit 35, the developer sheet 33 is discharged into a tray 36 with the developed image facing up.

The separated microcapsule sheet 11 travels past the adjustment roller 21e and is wound around the take up reel 23.

Figure 4:
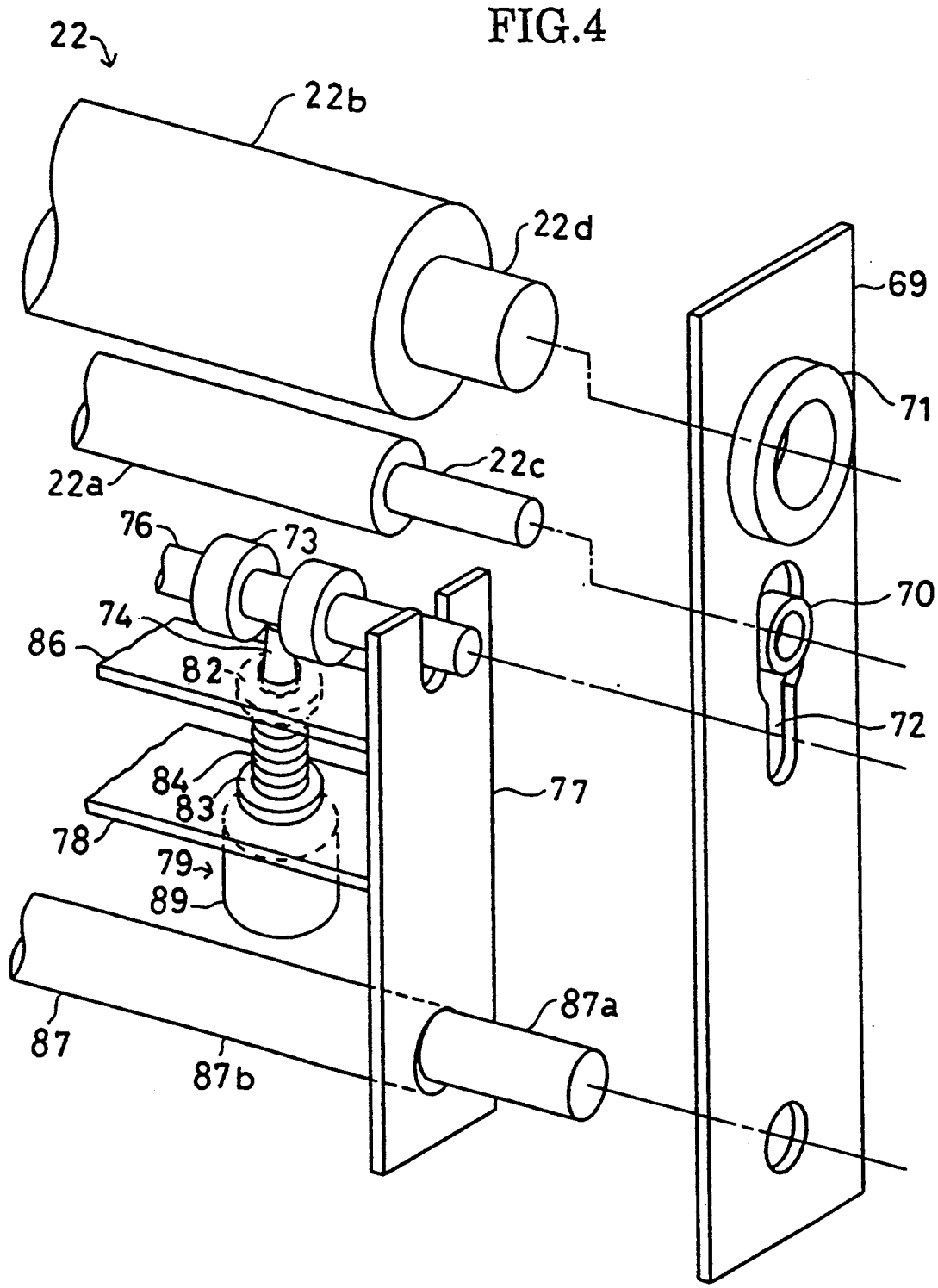
FIG. 4 an enlarged exploded perspective view showing the pressure developing in FIG. 2.

As shown in FIGS. 2, 3 and 4, this pressure developing unit 22 has a set of frames 69 fixed in the copying apparatus The frames 69 support a pair of pressure rollers 22a and 22b through bearings 70 and bearings 71.

Each pressure roller 22a and 22b has a roller shaft 22c and 22d. Each frame 69 has a hole 69a to support the pressure roller 22b. The bearings 71 engaged with the roller shaft 22d are inserted and fixed in the each frame 69, and the diameter of each hole 69a is almost same as the diameter of bearing 71. Each frame 69 has a slot 72 arranged in a vertical direction along the frame 69 to support the pressure roller 22a. The bearings 70 engaged with the roller shaft 22c are inserted in the slots 72 of the frames 69. The slots 72 have the necessary space to bring the bearings 70 close to the bearings 71 or to separate the bearings 70 from the bearings 71. Accordingly, the pressure roller 22a can move into and out of contact with the fixed pressure roller 22b. When the first roller 22a moves up, it comes in contact with the second roller 22b. Inversely, when the first roller 22a moves down, it separates from the second roller 22b.

A sprocket wheel 75 installed in the left end of the roller shaft 22d rotates together with the roller shaft 22d. When the first roller 22a comes in contact with the second roller 22b, the confronted roller 22a rotates together with the second roller 22b by means of a rotation of the sprocket wheel 75.

A pressure unit 73A is disposed under the roller 22a to pressurize the rollers 22a and 22b with a plurality of pressure conditions along the axial length of the rollers. The pressure unit 73A comprises a shaft 76 with a plurality of backup bearings 73 arranged at predetermined intervals in parallel with the roller shaft 22c and a plurality of pressure rod units 74A disposed under the shaft 76 and between a pair of the backup bearings 73. A pair of movable boards 77 for sliding along the vertical direction of the frames 69 are supported by each frame 69. The edges of the shaft 76 are fixed to the pair of movable boards 77. Preferably, ten backup bearings 73 can come in contact with the first roller 22a. There are five pressure rod units 74A, each disposed between a pair of backup bearings 73.

Each pressure rod unit 74A has a rod 74 which can be contacted with the shaft 76 and can be separated from the shaft 76, and is supported by the support member 78 whose edges are fixed to the movable boards 77. The pressure rod unit 74A comprises a rod 74 contacted with the shaft 76, a spring shoe 82 installed on the rod 74, a guide portion 81 located under the spring shoe 82, a coil spring 84 surrounding the guide portion 81, a spring shoe 83 located under the coil spring 84, a screw stick 80 located under the spring shoe 83, a screw stick 80 provided under the spring shoe 83, and an actuator 79 located under the screw stick 80.

The actuator 79 comprises a motor (not shown) and a reduction gear installed on the motor (not shown), both of which are accommodated in the motor holder 89. Each actuator 79 is fixed to the support member 78 through the motor holder 89. The support member 78 is fixed to the pair of the movable boards 77. The output shaft of each actuator 79 is installed in a spline shaft 85 and become united with the spline shaft 85. Further, each spline shaft 85 is inserted in the screw stick 80. Each spline shaft 85 can slide along the direction of the axis of the screw stick 80. However, each spline shaft 85 can not rotate in circumferential direction relative to the screw stick 80 because of the configuration of each spline shaft 85. The spline shaft 85 and the screw stick 80 are mutually fixedly engaged. The male screw formed in the outside of the screw stick 80 is engaged with the female screw formed in the support member 78. And, each spring shoe 83 is located on the screw stick 80. The coil spring 84 is located between the spring shoe 82 and the spring shoe 83 to bias the spring shoe 82 away from the spring shoe 83.

Each actuator 79 rotates the spline shaft 85 for rotating the screw stick 80. Then, the each pressure rod unit 74A pushes against the shaft 76 according to the projection stroke of the screw stick 80. The backup bearings 73 press the first roller 22a toward the second roller 22b. This pressurizing force or power between the first roller 22a and the second roller 22b is determined based on the each spring constant of each coil spring 84 and the projection stroke of each screw stick 80 so that each bearing 73 applies a particular pressure condition to that portion of the roller 22a in contact with the bearing 73. The projection stroke of each screw stick 80 is adjusted by the drive of each actuator 79. That is, the pressurizing power is strong when the projection stroke of each screw stick 80 is long, and the pressurizing power is weak when the projection stroke of each screw stick 80 is short. Therefore, the pressurizing power is adjusted by the driving power of each actuator 79 which receives electrical power supplied by a controller 50 described below. And, the ROM 50b in the controller 50 to be described below stores the data concerning the drive power of each actuator 79. The pressure applied along the axial length of the rollers can thus be adjusted as desired.

A stopper member 86 for obstructing the rise of the spring shoe 82 is fixed to the movable boards 77 to prevent the pressure rods 74 from excessively pushing the shaft 76.

The movable boards 77 are mounted on an eccentric cam 87, to slide along the inner surface of the frames 69. A shaft 87a of the eccentric cam 87 penetrates through the frames 69 and a sprocket wheel 88 is installed at the left end in FIG. 2. A cam portion 87b formed in cylindrical shape is installed in parallel with the pressure rollers 22a, 22b inserted in the movable boards 77 and is always contacted with the movable boards 77 to move the movable boards 77 upward or downward . And, as shown in FIG. 5(a), when the eccentric cam 87 comes to the bottom dead center, the pressure roller 22a separates from the pressure roller 22b. As shown in FIG. 5(c), when the eccentric cam 87 comes to the top dead center, the pressure roller 22a comes in contact with the pressure roller 22b. However, as shown in FIG. 5(b), before the eccentric cam 87 comes to the top dead center, the pressure roller 22a already comes in contact with the pressure roller 22b.

While the eccentric cam 87 rotates 180 degrees (from FIG. 5(a) to FIG. 5(c)) with the rotational movement of the sprocket wheel 88, the movable boards 77 slide along the frame 69 toward the pressure roller 22a and the pressure roller 22b. And the backup bearings 73 which come into the contact with the pressure roller 22a (as shown FIG. 5(b)) cause the pressure roller 22a to come in contact with the pressure roller 22b. While the eccentric cam 87 further rotates 180 degrees (from FIG. 5(c) to FIG. 5(a)), the movable boards 77 slide away from the pressure roller 22a and the pressure roller 22a is separated from the pressure roller 22b because the backup bearings 73 stop pressurizing the pressure roller 22a to separate the pressure roller 22a from the pressure roller 22b. The reason why the pressure roller 22a is separated from the pressure roller 22b is that the pressure roller 22a and the pressure roller 22b are prevented from becoming dirty and worn when contact between the rollers is unnecessary or undesirable.

There will next be described an arrangement of the controller 50, in the instant apparatus 1 by reference to the block diagram of FIG. 6.

The controller 50 includes an interface circuit 50e, and a main CPU (central processing unit) 50a, to which are connected through the interface circuit 50e, a control panel 61, sensors 41, 62, the pressure developing unit 22 including actuators 79, the thermal fixing unit 35, a sheet feeding unit 63, an exposure unit 64, a stand driver unit 65, an optical system driver unit 66 and a filter driver unit 67.

A control panel 61 has a start key 61a, and other input keys 61b. Sensors 41, 62 are disposed in this apparatus to transmit signal to CPU 50a to control this apparatus 1. The sheet feeding unit 63 has a developer sheet feeding portion 63A which controls the feed of the developer sheet 33, and a microcapsule sheet feeding portion 63B which controls the feed of the microcapsule sheet 11 and a separator roller driving portion 63c for driving the separator roller 21d. The exposure unit 64 controls the halogen lamp 5a to turn on and off. The stand driver unit 65 controls the stand glass 2 to move back and forth. The optical system unit 66 controls lens 7 and mirrors 8,9 to locate them in a suitable position. The filter driver unit 67 controls the filter 6 to locate it in a suitable position.

The CPU 50a is further connected to a ROM (read-only memory) 50b and a RAM (random-access memory) 50c. The RAM 50c acts as a work area for performing various sorts of processing and stores data temporarily, and the ROM 50b stores various sorts of processing programs and stores initial data. The CPU 50a operates to control the instant copying apparatus 1, according to a control program stored in the ROM 50b, while utilizing a temporary data storage function of the RAM 50c. The controller 50 controls the actuators 79 which drive each pressure rod unit 74A. The ROM 50b memorizes the data shown in FIG. 7, which is the distribution of the pressurizing force to be applied between the pressure roller 22a and the pressure roller 22b,and the data shown in FIG. 8 relating to a relation between the pressure and the moisture in the pressure developing device 22.

Figure 7:
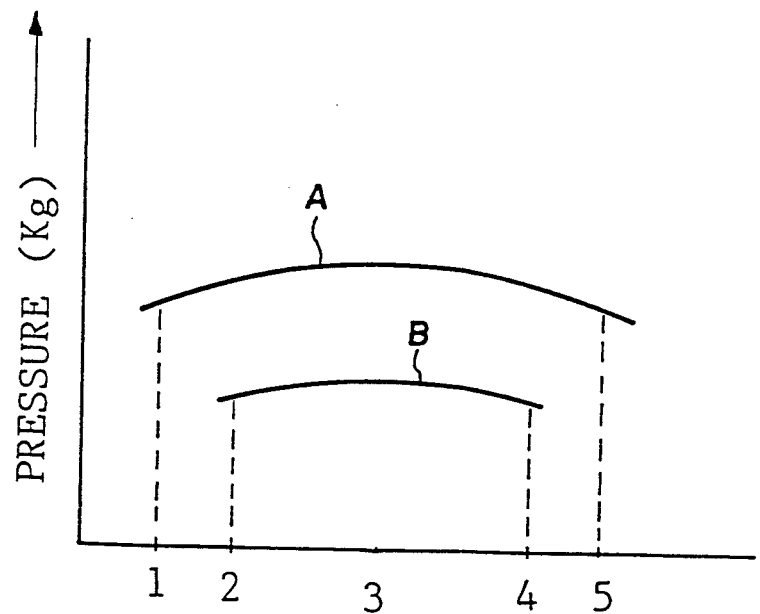
FIG. 7 is a graph showing a pressure distribution between a pair of the pressure developing rollers.
Figure 8:
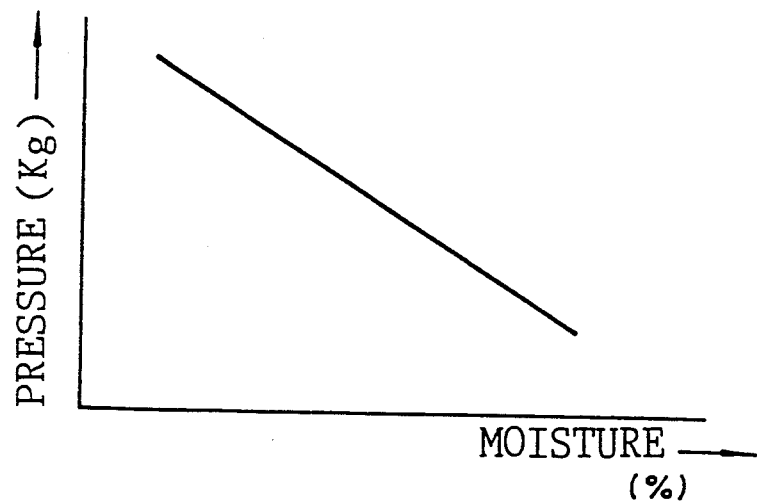
FIG. 8 is a graph showing a relation between the pressure and the moisture in the pressure developing device.

As shown in FIG. 7, curve A shows the distribution of the pressurizing force which is to occur between the pressure roller 22a and the pressure roller 22b by each of the five pressure rod units 74A when a wide developer sheet 33 is used. Curve B shows the distribution of the pressurizing force between the pressure roller 22a and the pressure roller 22b by each pressure rod unit 74A when a narrow developer sheet 33 is used. The purpose of making the curve convex prevents wrinkles from occurring easily in the developer sheet 33 by applying greater pressure at the central portion in the axial direction of the rollers, and less pressure at the axial end portions of the rollers. The reason why the pressurizing distribution shown by curve B is lower than the pressurizing distribution shown by curve A depends on the width of the developer sheet 33 . Accordingly, the wrinkle is not occurred easily in the developer sheet 33 by changing the pressurizing to the developer sheet 33 like this.

The sensor 41 located near the cassette 31, as shown in FIG. 1, detects the size of the developer sheet 33 and transmits a size signal to the controller 50. And according to the signal, the controller 50 chooses the distribution of the pressure force between the pressure rollers 22a, 22b in accordance with curve A or curve B. And, the controller 50 adjusts the pressurizing power signal as shown in curve A or curve B in FIG. 5 for output to the actuator 79.

The sensor 41 is a microswitch (not shown) which contacts with the paper edge of the paper 33. And, the controller 50 changes the output to each actuator 79 according to the signal transmitted from the sensor 62 for detecting the moisture content of the developer sheet 33.

This moisture sensor 62 located on the cassette 31 has a light emitting portion (not shown) to throw light onto the sheet 33 and a light receiving portion (not shown) to receive the reflected light from the sheet 33. The sensor 62 outputs a signal corresponding to the reflected light. The controller 50 controls the sensor 62 to examine the moisture content of the developer sheet 33 by detecting the reflection rate in the reflected light of the developer sheet 33 and to transmit the signal to the controller 50. According to the signal, the controller 50 adjusts the pressurizing power between the pressure roller 22a and the pressure roller 22b in inverse proportion to the amount of moisture, to prevent color nonuniformity and the change of color density.

Next, the operation of the image record apparatus will be explained below.

The halogen lamp 5a in the light source unit 5 emits light and the light which reflects on the original subject placed on the stand glass 2 is focused on the microcapsule sheet 11. The microcapsule sheet 11 is fed at constant level speed by feed rollers 21a, 21b and a take up roller 23 and exposed. After the microcapsule sheet 11 and the developer sheet 33 taken out of the cassette 31 are closely held against each other, they are introduced into the pressure developing unit 22.

Before the microcapsule sheet 11 and the developer sheet 33 reach the pressure developing unit 22, the pressure roller 22a separates from the pressure roller 22b due to a downward rotation of eccentric cam 87 (FIG. 5(a)). However, when the microcapsule sheet 11 and the developer sheet 33 reach the pressure developing unit 22, the controller 50 drives each actuator 79 according to the signal transmitted from the sensors 41, 62 and each actuator 79 projects its screw stick 80 in the amount signalled by the controller 50 in accordance with the data from FIGS. 7-8 stored in ROM 50b.

When the eccentric cam 87 rotates to the top dead center, the movable boards 77 move up with the actuators 79 (FIG. 5(c)). Then, as shown in FIGS. 2-5, the first roller 22a comes into contact with the second roller 22b. Therefore, each pressure coil spring 84 is compressed and receives a repulsion force on the first roller 22a from the second roller 22b through the each pressurizing rod unit 74A, and the each backup bearing 73, etc. When the microcapsule sheet 11 and the developing sheet 33 pass through the pressure developing unit 22, they are closely held against each other and are pressed together in moderation with the pressurizing force of FIGS. 7-8. Microcapsules on the microcapsule sheet 11 are ruptured under pressure, and a latent image on the microcapsule sheet 11 is transferred onto the developer sheet 33.

After the developer sheet 33 is separated from the microcapsule sheet by the separator portion 21d, the developer sheet 33 passes through the heat fixing unit 35 and is taken out outside the machine.

Next, the second embodiment will be explained below with reference to FIGS. 9-12.

Any duplicated explanation of this embodiment which has been described in the first embodiment in reference to FIGS. 2-8 will be omitted by using the same reference numerals.

Figure 9:
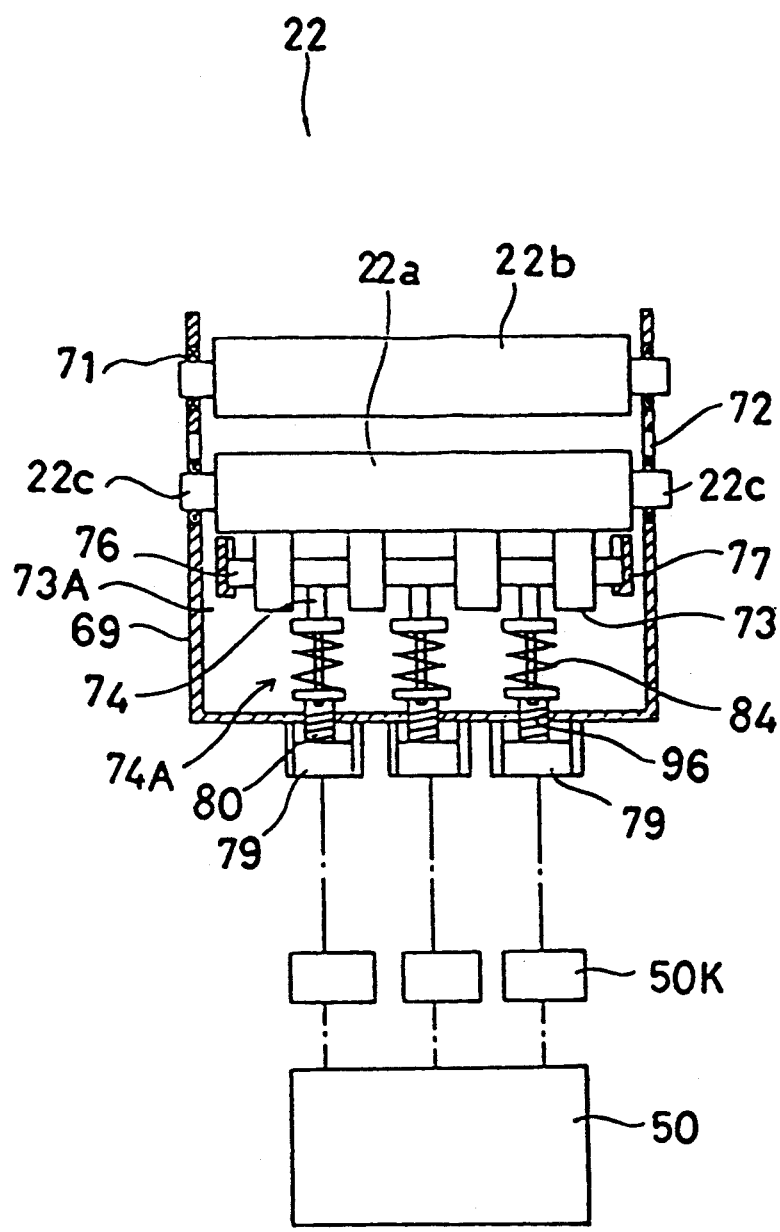
FIG. 9 is a schematic front sectional view showing a second embodiment of the pressure developing device when a pair of the pressure rollers are separated from each other.
Figure 10:
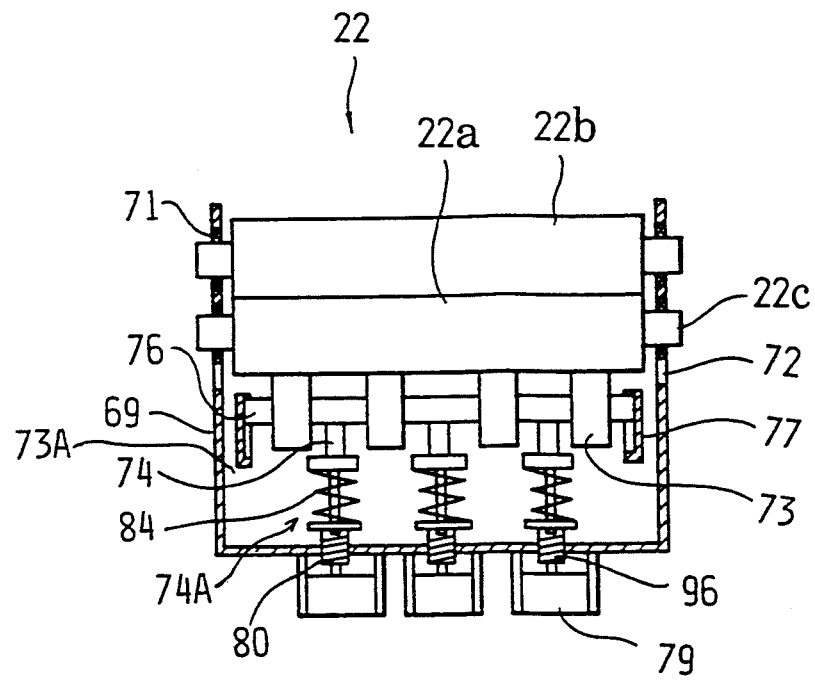
FIG. 10 is a schematic front sectional view showing the pressure developing device of FIG. 9 when the pair of the pressure rollers are in contact with each other.
Figure 11:
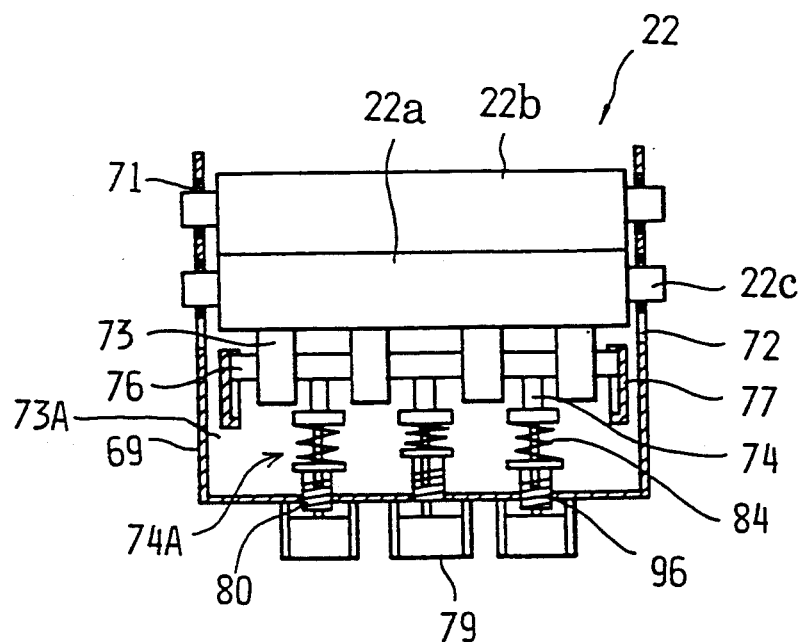
FIG. 11 a schematic front sectional view showing the pressure developing device of FIG. 9 when a pressure distribution between the pair of the pressure developing rollers is adjusted.

As shown in FIGS. 9-11, this pressure developing unit 22 has the frames 69 fixed in the image record apparatus. A set of the pressure rollers 22a and 22b are supported by the frames 69. The frames 69 support the pressure roller 22b rotatably through the slots 71. The slots 72 guide the pressure roller 22a into and out of contact with the pressure roller 22b.

The pressure unit 73A is located under the first roller 22a. The pressure unit 73A comprises the backup bearings 73 at predetermined intervals along the roller 22a and the pressure rods 74.

Four backup bearings 73 are set on the shaft 76 at equal intervals. The movable boards 77 which slide along the frames 69 support the shaft 76 rotatably. Three pressure rod units 74A are located among the plurality of backup bearings 73. And the upper part of the each pressurizing rod unit 74A comes in contact with the shaft 76.

The pressure rod 74 of the pressurizing rod unit 74A is driven by the actuator 79 which comprises the motor(not shown). The actuators 79 are fixed to the frames 69. The pressure rod unit 74A is connected with the actuator 79 which is controlled by the controller 50 as described below.

Figure 12:
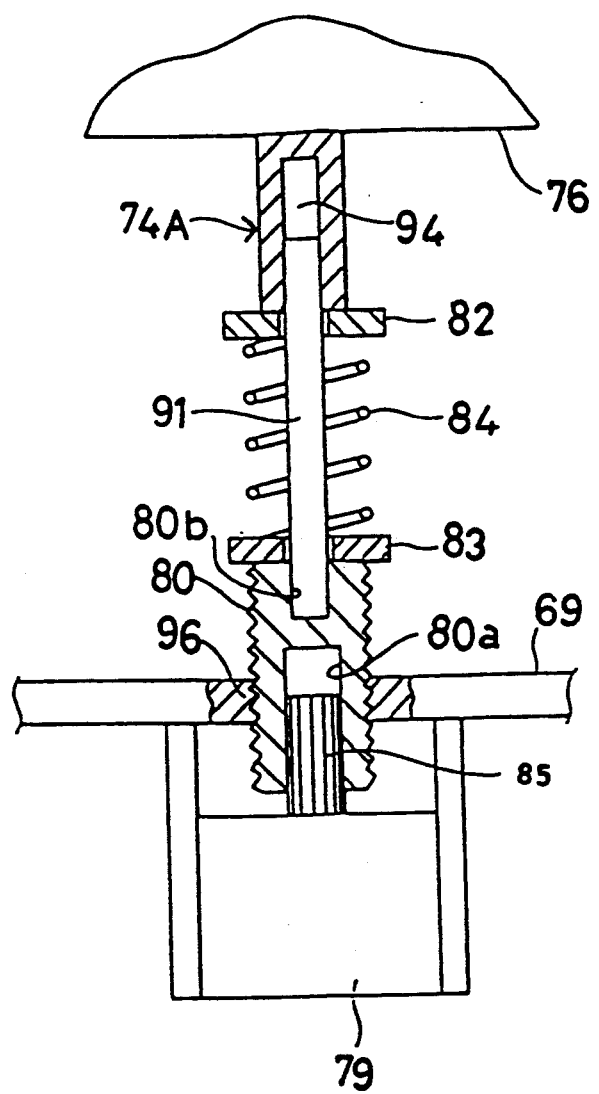
FIG. 12 is a schematic enlarged front sectional view showing the pressure unit in the pressure developing device shown in FIG. 9.

As shown in FIG. 12, each screw stick 80 is engaged with the female screw 96 formed in the frames 69 under which the actuator 79 is installed. The shaft 79a of each actuator 79 is formed as a spline shaft. And, the upper part of each spline shaft is inserted into the lower part of each screw stick 80. The lower part of a connecting rod 91 is inserted in each hole 80b made on the upper part of each screw stick 80, and is fixed. The upper part of each connecting rod 91 is inserted in each hole 94 on the lower part of each pressure rod unit 74A. Moreover, the spring shoes 82 and 83 are fitted in the connecting rod 91 and each coil spring 84 is located in between the spring shoe 82 and the spring shoe 83.

Therefore, each actuator 79 is driven to rotate each screw stick 80 in a positive direction. Then each screw stick 80 projects toward the second pressure roller 22band lifts up each connecting rod 91 to the pressure roller 22b. Moreover, when each actuator 79 is driven for making each screw stick 80 rotate in a negative direction, each screw stick 80 draws back to each actuator 79. And, when each screw stick 80 projects, each pressure rod unit 74A comes in contact with the shaft 76. Further, the shaft 76 is pressed from the lower side of it by the elastic action of each coil spring 84. When each screw stick 80 draws back, each pressure rod unit 74A separates from the shaft 76. Accordingly, the pressurizing force applied to the shaft 76 by each pressure rod unit 74A dwindles.

The backup bearings 73 press the roller 22a against the second roller 22b when the shaft 76 is pressed from its lower side by advancing the connecting rod 91. When the connecting rod 91 is retracted, the shaft 76 is not pressed from its lower side, and the backup bearings 73 do not press the roller 22a against the second roller 22b so that the roller 22a separates from the roller 22b.

When the roller 22a is pressed against the roller 22b, the compression power of each coil spring 84 is adjusted by adjusting the projection stroke of each screw stick 80. That is, the pressurizing force to pressure roller 22a can be adjusted at each pressure rod unit 74A.

The controller 50 controls the actuator 79 through an actuator driver circuit 50k. As shown in FIG. 9, the controller 50 outputs the signal for separating the roller 22b from the roller 22a to the driver circuit 50k when the pressure developing unit 22 is not operated. When developing is to be started, the controller 50 outputs the signal for evenly pressing the roller 22b against the roller 22a as shown in FIG. 9. Afterward, the controller 50 outputs the signal for pressing a central part of the roller 22a more strongly against the roller 22b (in accordance with the data of FIGS. 7-8) to the driver circuit 50k as shown in FIG. 11. The controller 50 memorizes the above mentioned distribution data of FIGS. 7-8 for applying this pressurizing force.

It is noted that the quality of the microcapsule sheet 11 or developer sheet 33 can deteriorate over time. For example, as a microcapsule sheet ages or becomes older, the microcapsules on the microcapsule sheet may become more hardened than microcapsules on a relatively younger microcapsule sheet. A sensor can be provided adjacent the sensors 41 and 62 described herein to read the manufacturing and/or expiration date of the microcapsule sheet or developing sheet and convey that information to the controller 50.

Moreover, the pressurizing force needs only to be changed with respect to the quality (i.e., the status of deterioration of the sheet due to aging), the width, and the moisture in the sheet such as the microcapsule sheet 11 and the developer sheet 33. The controller 50 inputs the signal transmitted from the sensor, selects the distribution of the pressurizing power (based on the age, width and/or moisture of the sheet) and a total pressure, etc., and outputs the signal to the driver circuit 50k of each actuator 79.

The quality and the width of the sheet 33 are detected by the data represented by indicia (not shown)attached the cartridge 33 accommodating the developer sheet 33. The moisture in the sheet is detected by detecting the reflection rate of the reflected light from the sheet.

The developer sheet 33 taken out of the cassette 31 and the latent image formed on the microcapsule sheet 11 are closely held against each other when they are introduced into the pressure developing unit 22. And as they pass between the roller 22a and the roller 22b, they are pressed together by the predetermined pressurizing force.

This invention is not limited to the described embodiments. This invention can be changed without deviating from the aim of variably controlling the pressurizing force across the axial length of the rollers. For instance, number of the pressure rod units 74A, the springs 84, and backup bearings 73 etc., can be changed according to the circumstance. Moreover, the pressure rod units 74A can directly support backup bearings 73 rotatably and the shaft 76 can be omitted. Further, the shaft 76 can be pressed not only by a method for compressing the each spring 84 through a projection of each screw stick 80 which is driven by each actuator 79 but also driven through a piston cylinder device, etc.

As another embodiment, an exposing means is not constructed so that an original supported by a stand glass is movable forth and back, and a light source is held at predetermined position, but may be constructed so that an original supported by a stand glass is held at a predetermined position, and a light source is movable forth and back for scanning.

Also as another embodiment, the controller is not composed of one CPU, but may be composed of two CPU's.

As many apparently widely different embodiments of this invention may be made without departing from the spirit and scope thereof, it is to be understood that the invention is not limited to the specific embodiments thereof except as defined in the appended claims.

What is claimed is:

1. A pressure developing device in an image recording apparatus for recording an image on a recording medium, comprising:

a pair of pressure developing rollers to be separated from and contacted with each other in a separation mode and a contact mode, respectively, the pair of pressure developing rollers each defining an axial length and being axially aligned;

pressurizing means disposed against at least one of the pressure developing rollers for pressurizing the at least one of the pressure developing rollers against another of the pressure developing rollers in the contact mode and separating the at least one of the pressure developing rollers from the other of the pressure developing rollers in the separation mode; and pressure control means for controlling the pressurizing means in the contact mode to pressurize the at least one of the pressure developing rollers against the other of the pressure developing rollers under a plurality of pressure conditions by the pressurizing means by varying pressure strength between the pair of pressure developing rollers along the axial length of the rollers, and for controlling the pressurizing means in the separation mode to separate the at least one of the pressure developing rollers from the other of the pressure developing rollers wherein the pressurizing means comprises a plurality of backup bearings arranged at predetermined intervals in parallel with the at least one roller and a plurality of pressure rod units each disposed between a pair of the backup bearings; and wherein the backup bearings are mounted on a shaft aligned with the at least one roller, and each pressure rod unit comprises a rod contacting the shaft, a first spring shoe installed on one end of the rod, a guide portion located under the first spring shoe, a coil spring surrounding the guide portion, a second spring shoe located under the coil spring, a screw stick located under the second spring shoe, and an actuator located under the screw stick.

2. The pressure developing device of claim 1, wherein each roller in the pair of pressure developing rollers includes a central axial portion located between axial end portions of the rollers, and the plurality of pressure conditions define a varying pressure profile in which the pressure strength decreases from the central axial portion toward the axial end portions.

3. A pressure developing device in an image recording apparatus for recording an image on a recording medium, comprising:

a pair of first and second pressure developing rollers to be separated from and contacted with each other in a separation mode and a contact mode, respectively, the pair of first and second pressure developing rollers each defining an axial length and being axially aligned;

a pair of frames for supporting the pair of the pressure developing rollers, and having slot bearing means for reciprocating the first pressure developing roller to separate the rollers in the separation mode and place the rollers in contact with each other in the contact mode, and having fixed bearing means for rotatably supporting the second pressure developing roller in the frames;

a plurality of pressurizing means acting upon the first pressure developing roller along the axial length of pressure developing rollers for pressurizing the first pressure developing roller relative to the second pressure developing roller;

pressure control means for controlling the plurality of the pressurizing means in the contact mode to pressurize the first pressure developing roller against the second pressure developing roller under a plurality of pressure conditions so that pressure strength between the pair of pressure developing rollers decreases from an axial center portion of the rollers to both axial end portions of the developing rollers, and for controlling the pressurizing means in the separation mode to separate the first pressure developing roller from the second pressure developing roller; and further comprising moisture sensor means for detecting a moisture content of the recording medium, and wherein the pressure control means further comprises memory means for memorizing data relating the plurality of pressure conditions to moisture in the recording medium, the pressure control means being responsive to the moisture sensor means to vary the pressure applied along the axial length of the rollers in relation to the moisture content.

4. The pressure developing device as defined in claim 3, wherein the pressure control means further comprises memory means for memorizing data relating to the plurality of pressure conditions desired between the first and second pressure rollers.

5. The pressure developing device as defined in claim 3, wherein said plurality of pressurizing means comprises a plurality of backup bearings arranged at predetermined intervals in parallel with the first roller and a plurality of pressure rod units disposed between a pair of the backup bearings.

6. The pressure developing device as defined in claim 5, wherein the backup bearings are mounted on a shaft aligned with the first pressure developing roller, and each pressure rod unit comprises a rod contacting the shaft, a first spring shoe installed on one end of the rod, a guide portion located under the first spring shoe, a coil spring surrounding the guide portion, a second spring shoe located under the coil spring, a screw stick located under the second spring shoe, and an actuator located under the screw stick.

7. A pressure developing device in an image recording apparatus for recording an image on a recording medium, comprising:

a pair of pressurizing rollers axially aligned with each other along an axial length of each roller, and selectively placed in contact with each other along their axial lengths in a contact mode and selectively separated from each other in a separation mode;

pressurizing means acting upon at least one of the pressurizing rollers for pressing the axial length of the at least one pressurizing roller against the axial length of another pressurizing roller in the contact mode and for separating the at least one pressurizing roller from the other pressurizing roller in the separation mode; and pressure control means for controlling the pressurizing means to vary pressure applied by the at least one pressurizing roller along the axial length of the at least one pressurizing roller in the contact mode, and to separate the rollers from each other in the separation mode;

wherein the pressurizing means includes a plurality of back-up bearings arranged along and in contact with the axial length of the at least one roller, and a plurality of pressure rod units acting on the back-up bearings;

each pressure rod unit comprises a spring biased rod biased against the shaft supporting the back-up bearings by a spring, and actuator means controller by the pressure control means for varying a biasing force of the spring; and each pressure rod unit further comprises a connecting rod extending between the spring biased rod and the actuator means, the actuator means advancing and retracting the connecting rod relative to the other pressurizing roller to separate the at least one roller from the other roller in the separation mode.

8. The pressure developing device of claim 7, wherein the pressure control means varies the pressure along the axial length of the at least one roller to decrease the pressure applied from a central axial portion of the roller to each axial end of the roller.

9. The pressure developing device of claim 7, wherein the back-up bearings are mounted on a shaft and each pressure rod unit is disposed between a pair of back-up bearings to contact the shaft.

10. The pressure developing device of claim 9, wherein the shaft for the back-up bearings is mounted in a movable frame means for reciprocating the back-up bearings relative to the other pressurizing roller to separate the at least one roller from the other roller in the separation mode and to contact the at least one roller with the other roller in the contact mode.

11. The pressure developing device of claim 10, wherein the movable frame means includes a frame for rotatably supporting the shaft on which the back-up bearings are mounted, and an eccentric cam shaft rotatable between first and second positions, the pressure control means rotating the cam shaft to the first position for the contact mode, and to the second position for the separation mode.

12. The pressure developing device of claim 7, wherein the rod includes a first spring shoe portion and the actuator means includes a second spring shoe portion, the actuator means further comprising a motor having an output shaft for reciprocating the second spring shoe portion relative to the first spring shoe portion to vary the biasing force of the spring.

13. The pressure developing device of claim 12, wherein a screw stick is disposed between the output shaft and the second shoe portion, the output shaft selectively advancing and retracting the screw stick relative to the first shoe portion to reciprocate the second shoe portion.

14. The pressure developing device of claim 7, further comprising moisture sensor means for detecting a moisture content of the recording medium, the pressure control means being responsive to the moisture sensor means to vary the pressure applied along the axial length of the rollers in relation to the moisture content.

15. The pressure developing device of claim 7, further comprising size sensor means for detecting a size of the recording medium, the pressure control means being responsive to the size sensor means to vary the pressure applied along a portion of the axial length of the roller, the portion of the axial length of the roller being in relation to the size of the recording medium.

* * * * *